United States Patent
Hata

(10) Patent No.: US 6,707,692 B2
(45) Date of Patent: Mar. 16, 2004

(54) CONTENT ADDRESSABLE MEMORY DEVICE CAPABLE OF BEING USED AS BINARY CAM DEVICE OR AS TERNARY CAM DEVICE AND STRUCTURE METHOD THEREFOR

(75) Inventor: Ryuichi Hata, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 10/062,414

(22) Filed: Feb. 5, 2002

(65) Prior Publication Data

US 2002/0080638 A1 Jun. 27, 2002

(30) Foreign Application Priority Data

Feb. 7, 2001 (JP) ........................................ 2001-031103

(51) Int. Cl.[7] .................. G11C 15/00; G11C 11/00; G11C 7/02; G11C 7/00; G11C 8/00
(52) U.S. Cl. .................. 365/49; 365/154; 365/214; 365/189.05; 365/189.08; 365/230.03; 365/230.04; 365/230.05; 365/230.06; 365/230.08; 365/233
(58) Field of Search .................. 365/49, 154, 214, 365/189.05, 189.08, 230.03, 230.04, 230.05, 230.06, 230.08, 233

(56) References Cited

U.S. PATENT DOCUMENTS

| | | | |
|---|---|---|---|
| 5,920,886 A | * 7/1999 | Feldmeier | 711/108 |
| 6,157,558 A | * 12/2000 | Wong | 365/49 |
| 6,259,620 B1 | * 7/2001 | Kling et al. | 365/49 |
| 6,574,702 B2 | * 6/2003 | Khanna et al. | 711/108 |
| 2002/0032681 A1 | * 3/2002 | Feldmeier et al. | 707/3 |
| 2003/0035331 A1 | * 2/2003 | Foss et al. | 365/200 |
| 2003/0046500 A1 | * 3/2003 | Abdat | 711/154 |
| 2003/0093613 A1 | * 5/2003 | Sherman | 711/104 |
| 2003/0123270 A1 | * 7/2003 | Pereira et al. | 365/49 |

* cited by examiner

Primary Examiner—David Nelms
Assistant Examiner—Ly Duy Pham
(74) Attorney, Agent, or Firm—Oliff & Berridge, PLC

(57) ABSTRACT

A content addressable memory (CAM) device according to the present invention is configured with binary CAM cells capable of holding binary data "0" and "1", and is capable of being used either as a binary CAM device with the binary CAM cells being used as binary CAM cells or as a ternary CAM device with the binary CAM cells being used as ternary CAM cells capable of holding ternary data in a way in which, in each pair of two bits of the binary CAM cells, three states, "0," "1," and "X (don't care)" are assigned to four states, "00," "01," "10," and "11," expressed by two-bit data stored in the pair. A CAM device according to the present invention is provided with a CAM array including a plurality of CAM words each formed of binary CAM cells; and a binary/ternary setting section for making a setting of a case in which the binary CAM cells are used as binary CAM cells or a setting of a case in which each pair of two bits of the binary CAM cells is used as a ternary cell.

14 Claims, 13 Drawing Sheets

FIG. 4A

| LOGICAL DATA | PHYSICAL DATA | | SEARCH DATA | SEARCH BIT LINE OUTPUTS (SB,/SB) |
|---|---|---|---|---|
| 0 | 0 | | 0 | 0 DRIVEN (0,1) |
| 1 | 1 | | 1 | 1 DRIVEN (1,0) |
| | | | DON'T CARE | DON'T CARE (0,0) |

FIG. 4B

| EXTERNAL DATA | LOGICAL DATA (CONVENTIONAL TERNARY CAM DATA) | | PHYSICAL DATA (INTERNAL DATA OF PRESENT INVENTION) | |
|---|---|---|---|---|
| | STORAGE DATA | MASK DATA | EVEN CELL | ODD CELL |
| 0 | 0 | 0 | 0 | 1 |
| 1 | 1 | 0 | 1 | 0 |
| DON'T CARE | X (UNDEFINED) | 1 | 1 | 1 |

| SEARCH DATA | SEARCH BIT LINE OUTPUTS (SB,/SB) | |
|---|---|---|
| | EVEN | ODD |
| 0 | DON'T CARE (0,0) | 0 DRIVEN (0,1) |
| 1 | 1 DRIVEN (1,0) | DON'T CARE (0,0) |
| DON'T CARE | DON'T CARE (0,0) | DON'T CARE (0,0) |

FIG. 5B

| STORAGE DATA | | | SEARCH DATA | | | ML_0 | ML_1 | Match_0 | Match_1 |
|---|---|---|---|---|---|---|---|---|---|
| DATA | EVEN (D0) | ODD (D1) | DATA | EVEN (SB0,/SB0) | ODD (SB1,/SB1) | | | | |
| 0 | 0 | 0 | 0 | (0,0) | (0,1) | 1 | 1 | | 1 |
| | | | 1 | (1,0) | (0,0) | 0 | 1 | | 0 |
| | | | X | (0,0) | (0,0) | 1 | 1 | 0 | 1 |
| 1 | 1 | 1 | 0 | (0,0) | (0,1) | 1 | 0 | | 0 |
| | | | 1 | (1,0) | (0,0) | 1 | 1 | | 1 |
| | | | X | (0,0) | (0,0) | 1 | 1 | 0 | 1 |
| X | 1 | 0 | 0 | (0,0) | (0,1) | 1 | 1 | | 1 |
| | | | 1 | (1,0) | (0,0) | 1 | 1 | | 1 |
| | | | X | (0,0) | (0,0) | 1 | 1 | 0 | 1 |

X: DON'T CARE

CONTENT ADDRESSABLE MEMORY DEVICE CAPABLE OF BEING USED AS BINARY CAM DEVICE OR AS TERNARY CAM DEVICE AND STRUCTURE METHOD THEREFOR

BACKGROUND OF THE INVENTION

1. Field of the Invention

The present invention relates to a content addressable memory (CAM) device which can be used as a binary CAM device, and also as a ternary CAM device in which ternary data, including binary data and "X (don't care)," can be specified, and to structure methods therefor.

2. Description of the Related Art

As Internet technologies have advanced in these years, it has been demanded that network relay apparatuses, such as switching hubs and routers, operate at high speeds with high-level functions. To satisfy such a demand, these relay apparatuses have used CAM devices for processing, such as address filtering and packet classification, in many cases.

CAM devices have also been used in layers 2, 3, and 4 of the network Open Systems Interconnection (OSI) model in many cases. In these cases, the length of search key data varies from 32 bits to more than 256 bits; conventionally binary CAM devices, which can have only "0" and "1" as data, are sufficient in some cases; and ternary CAM devices, which can have "0," "1," and "X (don't care)" as data, are required in other cases.

Conventional binary CAM and ternary CAM devices will be described below.

FIG. 10 is a structural block diagram of a conventional CAM device.

The CAM device 90 shown in FIG. 10 is provided with a m-bit by n-word CAM array 92; an input-and-output (I/O) circuit 94 for driving write-in data, read-out data, and search data; a decoder 96 for decoding an address signal ADR to specify a CAM word corresponding thereto; and a priority encoder 98 for encoding the match lines word for which matching has been detected, according to a priority and for outputting the addresses of the CAM words having the match lines.

In the CAM device 90, write-in data input from the outside by the I/O circuit 94 is written into a CAM word selected by the decoder 96 according to an address signal ADR, as storage data. Storage data is read from a CAM word selected by the decoder 96 and output to the outside by the I/O circuit 94 as read-out data.

Search data input from the outside is driven by the I/O circuit 94, and a search operation is performed between the search data and storage data for all CAM words. The result of search for each CAM word is input to the priority encoder 98 through a match line, and the memory address of a CAM word for which matching has been detected is sequentially output as a highest hit address (HHA), according to a predetermined priority.

A binary CAM device has binary CAM cells, and a ternary CAM device has ternary CAM cells.

FIG. 11 is a circuit diagram of a binary CAM cell used in a conventional CAM device. The binary CAM cell 100 shown in FIG. 11 is formed of a data storage portion 102 for storing one-bit data, "0" or "1," and a match detector 104 for comparing data stored in the data storage portion 102 with search data input from the outside of the CAM device and for outputting a matching-detection result.

The data storage portion 102 is formed of a static RAM (SRAM) conventionally known to the public, and includes two inverters 46a and 46b and two n-type MOS transistors (NMOSS) 48a and 48b. In the two inverters 46a and 46b, the output terminal, of each of them is connected to the input terminal of the other. The NMOS 48a is connected between the input terminal of the inverter 46a and a bit line BL, and the NMOS 48b is connected between the input terminal of the inverter 46b and a bit bar line /BL. The gates of the two NMOSs are connected in common to a word line WL.

The match detector 104 is formed of four NMOSs 50a, 50b, 52a, and 52b. The NMOSs 50a and 52a are connected in series between a match line ML and the ground, the gate of the NMOS 50a is connected to the output terminal (D) of the inverter 46b, and the gate of the NMOS 52a is connected to the bit line BL. The NMOSs 50b and 52b are connected in series between the match line ML and the ground, the gate of the NMOS 50b is connected to the output terminal (/D) of the inverter 46a, and the gate of the NMOS 52b is connected to the bit bar line /BL.

In the binary CAM device having the binary CAM cell 100, searching is performed in a way in which the bit line BL and the bit bar line /BL are set to a low level to turn off the NMOSs 52a and 52b, the match line ML is pre-charged to a power potential, and then, search data is driven to the bit bar line /BL and search data bar is driven to the bit line BL.

When storage data matches the search data, since the NMOS 52a or 52b connected in series to whichever is on according to the storage data, of the NMOSs 50a and 50b becomes off, the match line ML maintains a pre-charge state. On the other hand, if no matching is found, since the NMOS 52a or 52b corresponding to whichever is on, of the NMOSs 50a and 50b becomes on, the match line ML is discharged through whichever pair is both on, of the NMOSs 50a and 52a, and the NMOSs 50b and 52b.

FIG. 12 is a structural circuit diagram of a ternary CAM cell used in a conventional CAM. The ternary CAM cell 106 is formed of a data storage portion 102 having the same structure as in the above-described binary CAM cell 100, a mask-data storage portion 108 for storing data which determines whether to mask matching detection between storage data stored in the data storage portion 102 and search data, and a match detector 110 for comparing the storage data stored in the data storage portion 102 with the search data when masking is not performed by the mask-data storage portion 108 and for outputting a matching-detection result.

The mask-data storage portion 108 is formed of a static RAM (SRAM) in the same way as for the data storage section 102, and includes two inverters 112a and 112b and two NMOSs 114a and 114b.

The match detector 110 has a NMOS 116 in addition to the components of the match detector 104 of the binary CAM cell 100 shown in FIG. 11. The NMOS 116 is connected between a match line ML and the drains of the NMOSs 50a and 50b, and its gate is connected to the output terminal (/M) of the inverter 112a of the mask-data storage portion 108.

A search operation in the ternary CAM device having the ternary CAM cell 106 is performed in a way in which, when the mask-data storage portion 108 stores "0" as mask data M (M=0, /M=1), since the NMOS 116 in the match detector 110 is turned on, the ternary CAM device performs the same function as the binary CAM device having the above-described binary CAM cell 100. On the other hand, when the mask-data storage portion 108 stores "1" as mask data M (M=1, /M =0), since the NMOS 116 is turned off, the match line ML has a high level irrespective of the state of the storage data (D), namely, always maintains a match state.

In this way, the CAM device having the ternary CAM cell 106 allows the search function to be masked by independently specifying a "don't care" for the CAM cell of each bit constituting each word. This function is called a local mask. In contrast, there has been known to the public a CAM device having a function for masking a search function for the same-position bits of all CAM words by applying "0" to the bit line BL and the bit bar line /BL. This function is called a global mask.

Conventional binary CAM devices having the above structure cannot be used as ternary CAM devices because a "don't care" cannot be specified as storage data itself in the binary CAM devices.

When conventional ternary CAM devices are used as binary CAM devices, all mask data used for specifying a "don't care" needs to be set to a no-mask state. In this case, however, since mask bits unnecessary for binary CAM devices are provided, an increase in bit cost occurs. In addition, a data writing operation needs to be performed twice, once for the data storage portion and once for the mask-data storage portion, in the ternary CAM devices whereas a data writing operation is required only once in binary CAM devices.

SUMMARY OF THE INVENTION

It is an object of the present invention to solve the problems caused by the conventional technology and to provide a CAM device which can be used as binary CAM device or a ternary CAM device, and which does not use storage bits wastefully even if the CAM device is used as a binary CAM device, and a structure method therefor.

To achieve the foregoing object, the present invention provides a content addressable memory (CAM) device configured with binary CAM cells capable of holding binary data "0" and "1", and capable of being used either as a binary CAM device with the binary CAM cells being used as binary CAM cells or as a ternary CAM device with the binary CAM cells being used as ternary CAM cells capable of holding ternary data in a way in which, in each pair of two bits of the binary CAM cells, three states, "0," "1," and "X (don't care)" are assigned to four states, "00," "01," "10," and "11," expressed by two-bit data stored in the pair.

The each pair of binary CAM cells may be included in two different CAM words, or included in one CAM word.

It is preferred that, during search, a pair of search bit lines used for one binary CAM cell of the each pair of the binary CAM cells and a pair of search bit lines used for the other binary CAM cell be separately controlled.

It is also preferred that, when the CAM device is used as a ternary CAM device, data conversion processing be applied to storage data, mask data (for local mask), and search data between external data (logical data) and internal data (physical data).

The present invention also provides a CAM device including a CAM array including a plurality of CAM words each formed of binary CAM cells; and binary/ternary setting means for making a setting of a case in which the binary CAM cells are used as binary CAM cells or a setting of a case in which each pair of two bits of the binary CAM cells is used as a ternary cell. It is preferred that the CAM device include a logical-data/physical-data conversion circuit for converting logical data input from the outside to physical data used in the inside of the CAM device, and vice versa, according to the setting of the binary/ternary setting means.

The present invention further provides a structure method for a CAM device configured with binary CAM cells capable of holding binary data "0" and "1," wherein, in each pair of two bits of the binary CAM cells, three states, "0," "1," and "X (don't care)" are assigned to four states, "00," "01," "10," and "11," expressed by two-bit data stored in the pair to implement the function of a ternary CAM cell capable of holding ternary data.

BRIEF DESCRIPTION OF THE DRAWINGS

FIG. 4A shows the relationship between logical data and physical data, and the relationship between search data and search bit line outputs, used when the CAM device according to the embodiment of the present invention is used as a binary CAM device. FIG. 4B shows the relationship among external data, storage data and mask data (logical data) in a conventional ternary CAM device, and internal data (physical data), and the relationship between search data and search bit line outputs, used when the CAM device is used as a ternary CAM device.

FIG. 5B shows a table indicating search results obtained when the pair of binary CAM cells shown in FIG. 5A is used as a ternary CAM cell.

DESCRIPTION OF THE PREFERRED EMBODIMENTS

A CAM device and a structure method therefor according to the present invention will be described below in detail with the use of preferred embodiments shown in the attached drawings.

Figure 1:
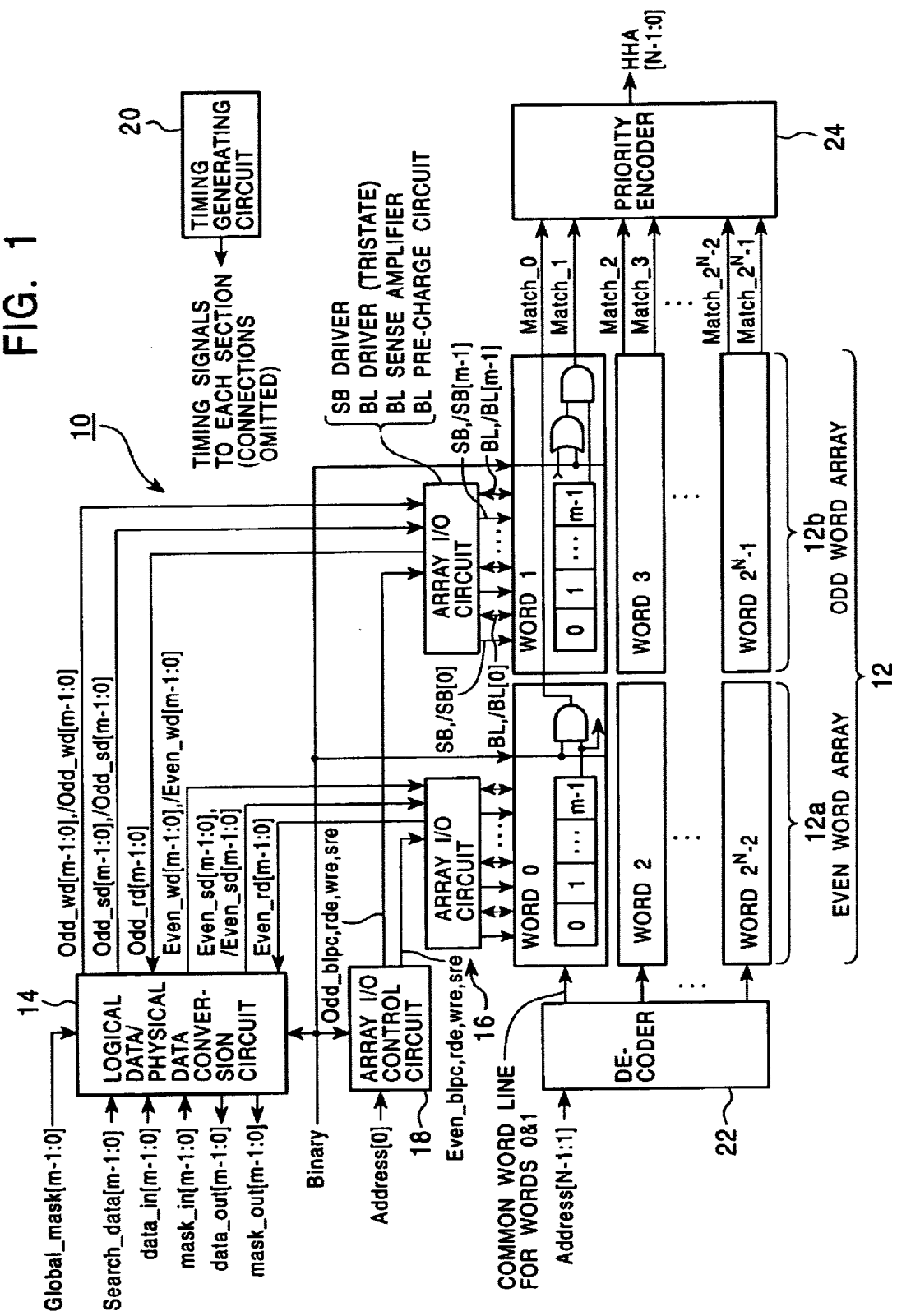
FIG. 1 is an outlined structural view of a CAM device according to an embodiment of the present invention.

FIG. 1 is an outlined structural view of a CAM device according to an embodiment of the present invention.

The CAM device 10 shown in FIG. 1 can be used as a binary CAM device or a ternary CAM device, and is provided with a CAM array 12, a logical-data/physical-data conversion circuit 14, array input-and-output (I/O) circuits 16, an array I/O control circuit 18, a timing generating circuit 20, a decoder 22, and a priority encoder 24.

Whether the CAM device 10 is used as a binary CAM device or a ternary CAM device is determined by a signal Binary. The signal Binary is sent directly from the outside of the CAM device 10, or from a register inside the CAM device 10. In the present embodiment, when the signal Binary is set to 1, the CAM device 10 serves as a binary CAM device, and when the signal Binary is set to 0, the CAM device 10 serves as a ternary CAM device.

Figure 11:
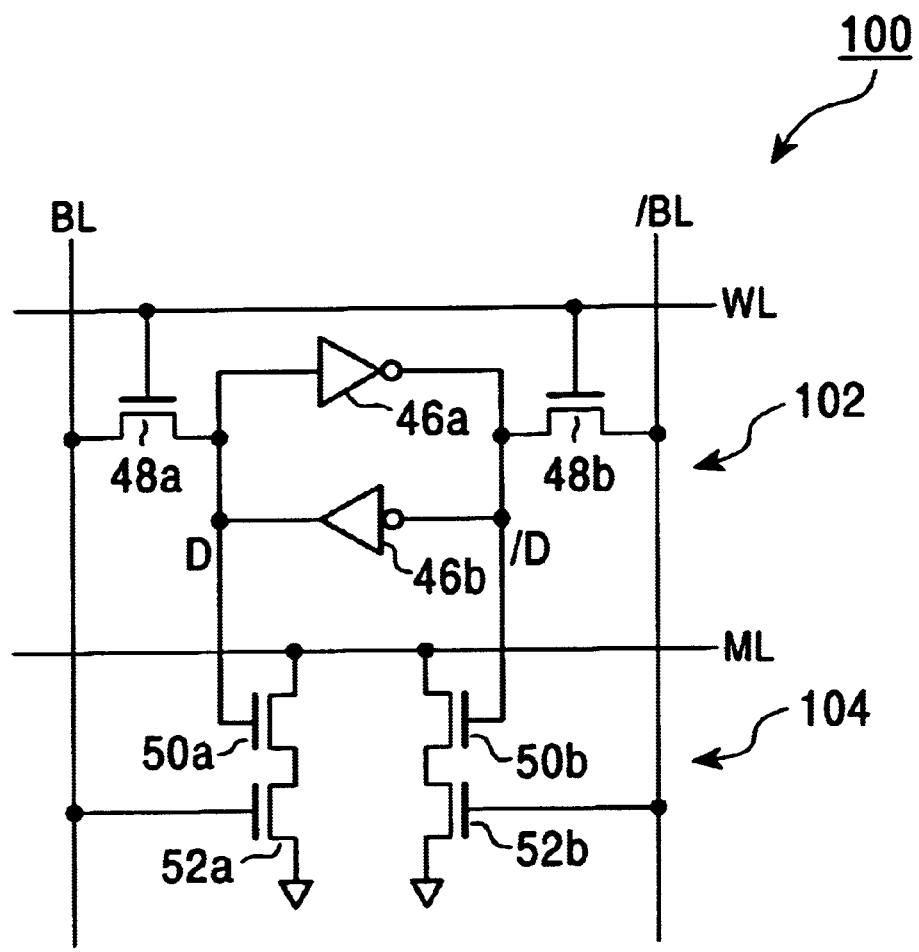
FIG. 11 is a circuit diagram of a binary CAM cell used in the conventional CAM device.

When the CAM device 10 is used as a binary CAM device, the CAM device 10 operates in the same way as the conventional binary CAM device formed, for example, with the use of the binary CAM cell 100 shown in FIG. 11.

When the CAM device 10 is used as a ternary CAM device, two bits of binary CAM cells are used as a unit, and three states of "0," "1," and "X (don't care)" are assigned to four states of "00," "01," "10," and "11," which can be expressed by two bits in each unit of binary CAM cells. Then, the CAM device 10 operates in the same way as the conventional CAM device formed, for example, by the use of the ternary CAM cell 106 shown in FIG. 12.

In the CAM device 10 shown in FIG. 1, the CAM array 12 has $2^N$ CAM words specified by consecutive addresses 0, 1, 2, ..., and $2^N-1$. In the present embodiment, $2^{N-1}$ CAM words specified by even addresses 0, 2, ..., and $2^{N-2}$ are collectively called an even word array 12a, and $2^{N-1}$ CAM words specified by odd addresses 1, 3, ..., and $2^{N-1}$ are collectively called an odd word array 12b.

Each CAM word included in the even word array 12a and the corresponding CAM word included in the odd word array 12b form a pair. For example, a CAM word 0 included in the even word array 12a and a CAM word 1 included in the odd word array 12b form a pair. Each CAM word included in the CAM word array 12 is formed of m-bit binary CAM cells.

Figure 2:
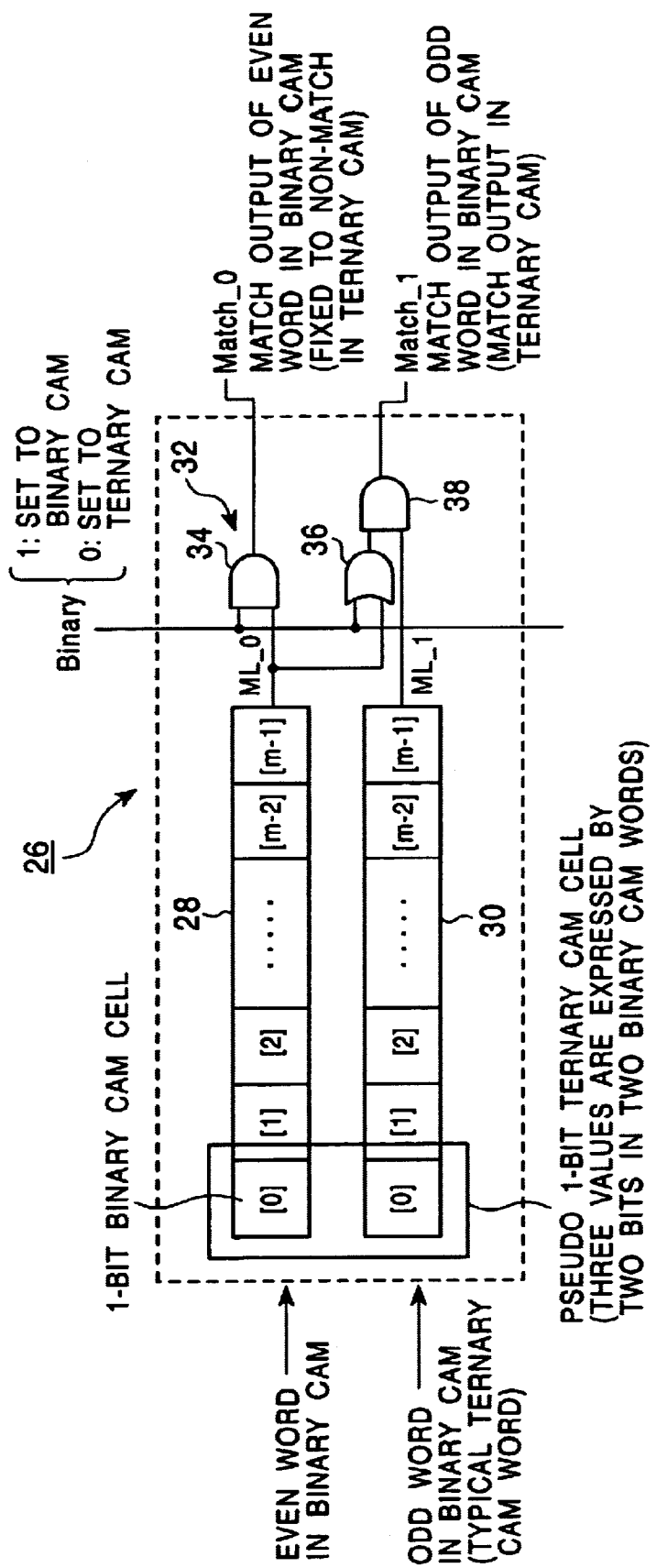
FIG. 2 is an outlined structural view of a pair of CAM words used in the CAM device according to the embodiment of the present invention.

FIG. 2 is an outlined structural view of a pair of CAM words used in the CAM device according to the embodiment of the present invention. A pair 26 of CAM words shown in FIG. 2 combines a CAM word (hereinafter called an even CAM word, such as the CAM word 0 shown in FIG. 1) 28 included in the even word array 12a with a CAM word (hereinafter called an odd CAM word, such as the CAM word 1 shown in FIG. 1) 30 included in the odd word array 12b to implement the function of a ternary CAM cell.

In FIG. 2, the even CAM word 28 and the odd CAM word 30 are disposed vertically due to convenience. It is preferred in the CAM device 10 that the even CAM word 28 and the odd CAM word 30 be disposed horizontally in terms of layout wiring efficiency, as shown in FIG. 1, because pairs of bit lines BLs and /BLs and pairs of search bit lines SBs and /SBs need to be controlled independently for the even CAM word 28 and for the odd CAM word 30.

The pair 26 of CAM words includes a control circuit 32 in addition to the even CAM word 28 and the odd CAM word 30. The control circuit 32 controls the match-line outputs of the even CAM word 28 and the odd CAM word 30 according to the signal Binary, which determines whether to use the CAM device 10 as a binary CAM device or a ternary CAM device. In FIG. 2, the control circuit 32 is formed of an AND gate 34, an OR gate 36, and an AND gate 38.

To the AND gate 34 and to the OR gate 36, the signal Binary and the match-line output ML_0 are input in common. A match-line output Match_0 is output from the AND gate 34. The output of the OR gate 36 and the match-line output ML_1 of the odd CAM word 30 are input to the AND gate 38. A match-line output Match_1 is output from the AND gate 38.

Figure 3:
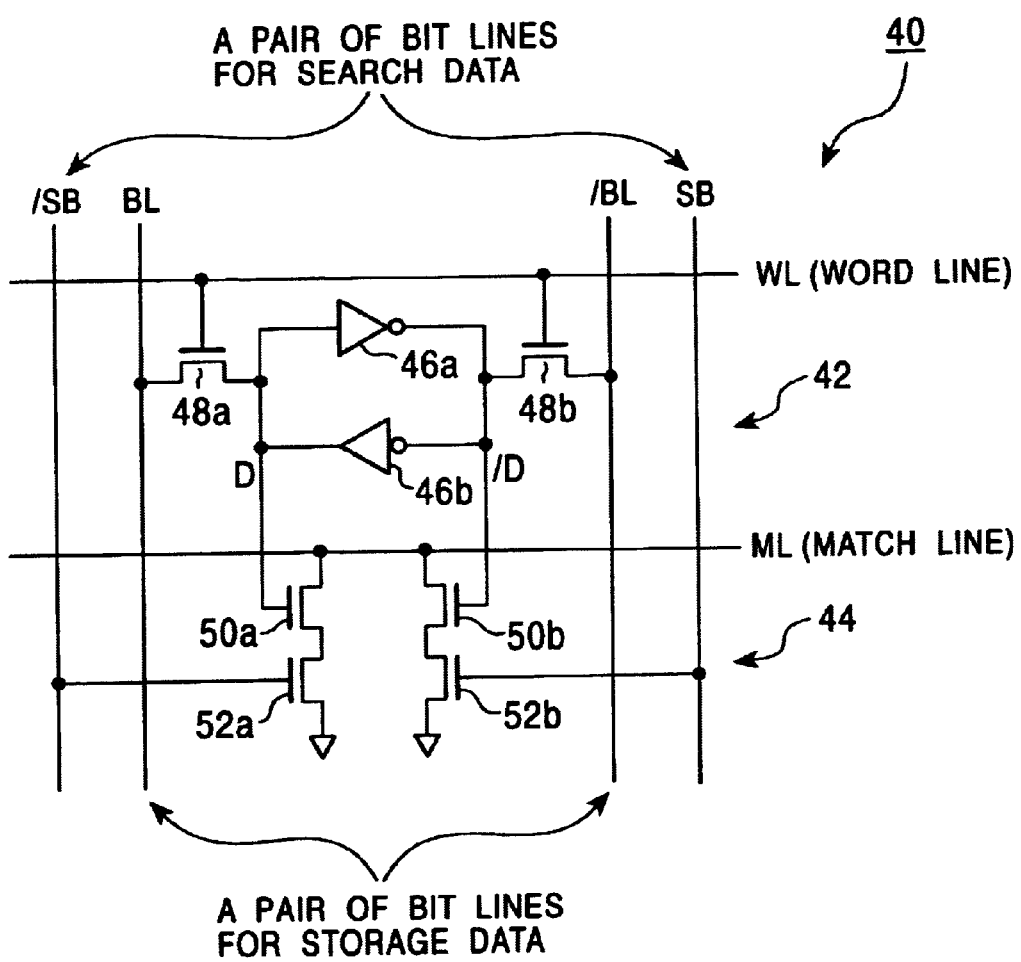
FIG. 3 is a circuit diagram of a binary CAM cell used in the CAM device according to the embodiment of the present invention.

FIG. 3 is a circuit diagram of a binary CAM cell used in the CAM device according to the embodiment of the present invention. The binary CAM cell 40 is made by separating a pair of bit lines BL and /BL shared by storage data and search data in the binary CAM cell 100 shown in FIG. 11 into a pair of bit lines BL and /BL for storage data and a pair of search bit lines SB and /SB. Therefore, the same symbols as those indicated in FIG. 11 are assigned to the same components, and detailed descriptions thereof are omitted.

Since pairs of bit lines are separated for storage data and for search data, this binary CAM cell 40 has advantages of high-speed operations and low power consumption compared with the binary CAM cell 100 shown in FIG. 11. In a CAM device of the present invention, any binary CAM cells having structures already known to the public can be used instead of the binary CAM cells 40 and 100 shown in FIG. 3 and FIG. 11. In other words, CAM cells which can be used in a CAM device according to the present invention need to be binary CAM cells, and the structures of their data storage portion and match detectors are not limited.

When the CAM device 10 is used as a binary CAM device, the even CAM word 28 and the odd CAM word 30 are independently used as binary CAM words. In contrast, when the CAM device 10 is used as a ternary CAM device, each of the CAM cells 40 of the even CAM word 28 and a CAM cell 40 corresponding thereto in the odd CAM word 30 form a pair, and two bits of binary CAM cells are used as a ternary CAM cell.

In other words, three states among the four states, "00," "01," "10," and "11," which can be specified in storage data in a pair of binary CAM cells are used for three states, "0," "1," and "X (don't care)," of a ternary CAM cell. In the present embodiment, for example, "00" in a pair of binary CAM cells indicates "0" in a ternary CAM cell, "11" indicates "1," and "10" indicates "X (don't care)." Assignment of "0," "1," and "X" in a ternary CAM cells to states in a pair of binary CAM cells is not restricted.

In the present embodiment, when the CAM device 10 is used as a ternary CAM device, CAM cells 0, 1, 2, ..., and m-1 included in the even CAM word 28 are associated with the CAM cells having the same bit numbers, 0, 1, 2, ..., and m-1, included in the odd CAM word 30 to form pairs of cells in each pair 26 of CAM words. Association of cells is not limited. Each CAM cell included in the even CAM word 28 may be associated with any CAM cell included in the odd CAM word 30.

A case in which a binary CAM cell is used as is as a binary CAM cell and a case in which a pair of binary CAM cells are used as a ternary CAM cell will be described below by referring to relationship tables shown in FIG. 4A and FIG. 4B.

FIG. 4A shows the relationship between external data (logical data) and internal cell data (physical data), and the relationship between search data and search bit line outputs in a case in which the CAM device 10 is used as a binary CAM device.

When the CAM device 10 is used as a binary CAM device (signal Binary=1), the AND gates 34 and 38 in the control circuit 32 output the match-line output ML_0 of the even CAM word 28 and the match-line output ML_1 of the odd CAM word 30 as match-line outputs Match_0 and Match_1, and the even CAM word 28 and the odd CAM word 30 function independently.

More specifically, as shown in the tables of FIG. 4A, when storage data "0" is written into a predetermined CAM cell of the CAM device 10 from the outside, storage data "0" is input and it is written as is into the CAM cell as cell data in the same way as in a conventional binary CAM device. Storage data "1" is written in the same way.

When storage data "0" is read from a CAM cell, it is output to the outside of the CAM device 10 as is as storage data. Storage data "1" is read in the same way.

When search data "0" is input, a pair of SB and /SB of search bit lines in the CAM cell 40 is driven by "0" and "1" (hereinafter called 0-driven), respectively. When search data "1" is input, a pair of SB and /SB is driven by "1" and "0" (hereinafter called 1-driven), respectively. When search data "don't care" (global mask) is specified, a pair of SB and /SB is both driven by "0."

Figure 12:
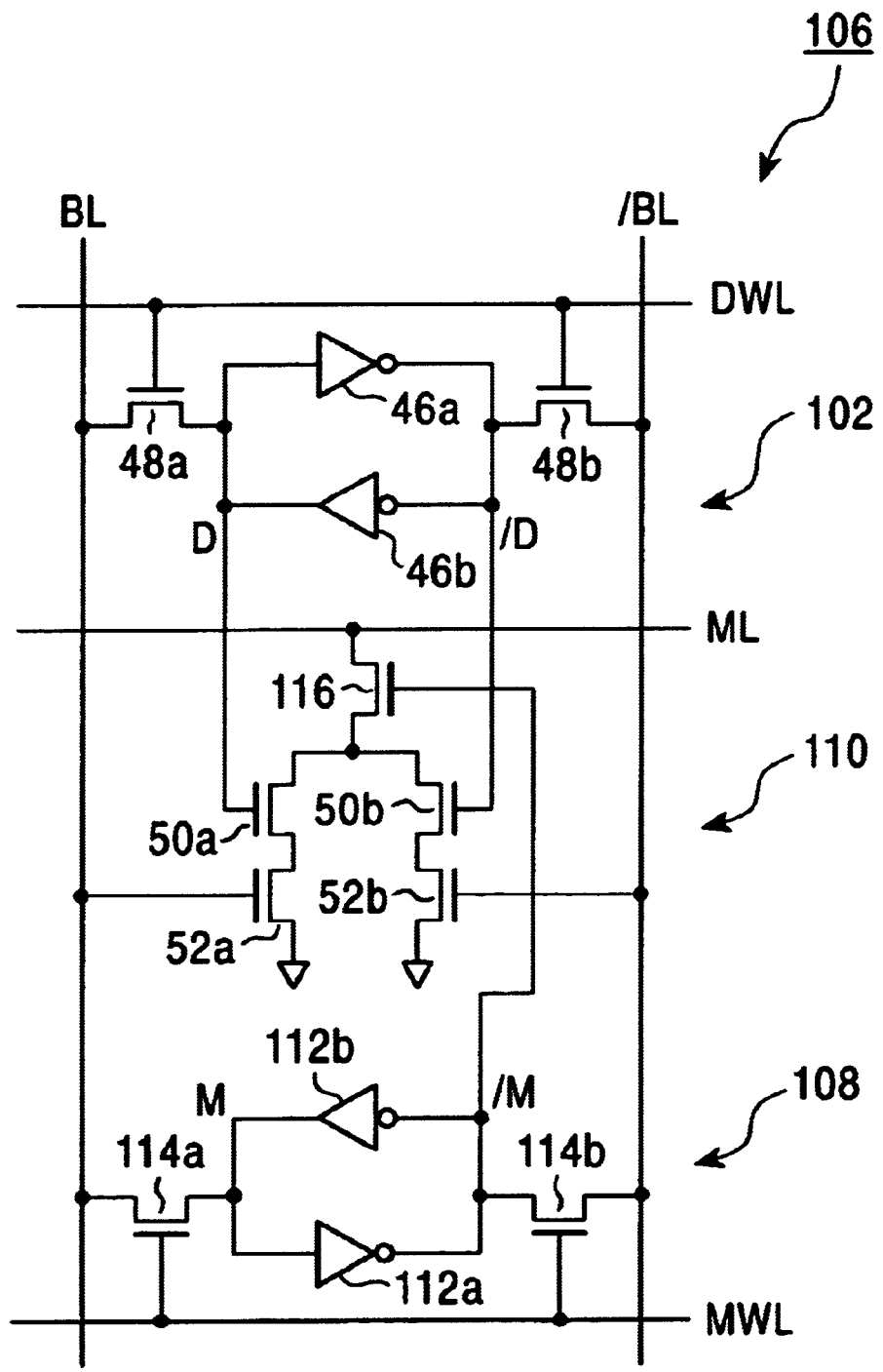
FIG. 12 is a circuit diagram of a ternary CAM cell used in the conventional CAM device.

FIG. 4B includes a table showing the relationship among external data, storage data and mask data (both regarded as logical data) in a conventional ternary CAM cell, for example, the ternary CAM cell shown in FIG. 12, and internal data (physical data), and a table showing the relationship between search data and search bit line outputs (of even word and odd word) in a case in which the CAM device 10 is used as a ternary CAM device.

When the CAM device 10 is used as a ternary CAM device (signal Binary=0), the AND gate 34 in the control circuit 32 always outputs a low level as the match-line output Match_0 in the pair 26 of CAM words shown in FIG. 2, which means that non-match is always detected. The AND gate 38 outputs the logical product of the match-line output ML_0 of the even CAM word 28 and the match-line output ML_1 of the odd CAM word 30 as the match-line output Match_1.

In other words, when the CAM device 10 is used as a ternary CAM device, AND search is applied to the even CAM word and the odd CAM word. In the present embodiment, the odd CAM word 30 serves as a representative word of the pair 26 of CAM words. The representative word may be assigned to either of the pair 26 of CAM words. Therefore, since the pair 26 of CAM words serves as a ternary CAM word, the number of words is half of that of words obtained when the CAM device 10 is used as a binary CAM device.

As shown in FIG. 4B, when data "0" is to be written, "0, 0" is input as logical data to a conventional ternary CAM device having, for example, the ternary CAM cell shown in FIG. 12. This "0, 0" corresponds to storage data and mask data set in the ternary CAM cell 106 shown in FIG. 12. When "0, 0" is input as logical data, "0" is written as physical data into both a cell of the even CAM word and the corresponding cell of the odd CAM word in the CAM device 10 according to the present invention.

When data "1" is to be written, "1, 0" is input as logical data. When "1, 0" is input as logical data, "1" is written as physical data into both a cell of the even CAM word and the corresponding cell of the odd CAM word in the CAM device 10 according to the present invention.

When data "don't care" is to be specified, "X (undefined), 1" is input as logical data, where X (undefined) means either "0" or "1." When "X, 1" is input as logical data, "1" is written as physical data into a cell of the even CAM word and "0" is written into the corresponding cell of the odd CAM word in the CAM device 10 according to the present invention.

When "0, 0" is read from a cell of the even CAM word 28 and the corresponding cell of the odd CAM word 30 as physical data, "0, 0" is output as logical data, and it is determined by the outside that data "0" is read.

When "1, 1" is read from a cell of the even CAM word 28 and the corresponding cell of the odd CAM word 30 as physical data, "1, 0" is output as logical data, and it is determined by the outside that data "1" is read.

When "1, 0" is read from a cell of the even CAM word 28 and the corresponding cell of the odd CAM word 30 as physical data, "X (undefined), 1" is output as logical data, and it is determined by the outside that data "don't care" is read.

When search data "0" is input, only the pair SB and /SB of search bit lines of a cell of the odd CAM word 30 are driven by "0" and "1" (0-driven), respectively. In this case, the pair SB and /SB of search bit lines of the corresponding cell of the even CAM word 28 are driven by "0" and "0" (don't-care-driven), and matching is always detected. Therefore, when search data "0" is input, if storage data "0" and "X" have been stored, matching is detected.

When search data "1" is input, only the pair SB and /SB of search bit lines of a cell of the even CAM word 28 are driven by "1" and "0" (1-driven), respectively. In this case, the pair SB and /SB of search bit lines of the corresponding cell of the odd CAM word 30 are driven by "0" and "0" (don't-care-driven), and matching is always detected. Therefore, when search data "1" is input, if storage data "1" and "X" have been stored, matching is detected.

When search data "don't care" (global mask) is specified, the pairs SBs and /SBs of search bit lines of a cell of the even CAM word 28 and the corresponding cell of the odd CAM word 30 are all driven by "0" and "0," and matching is always detected.

Figure 5A:
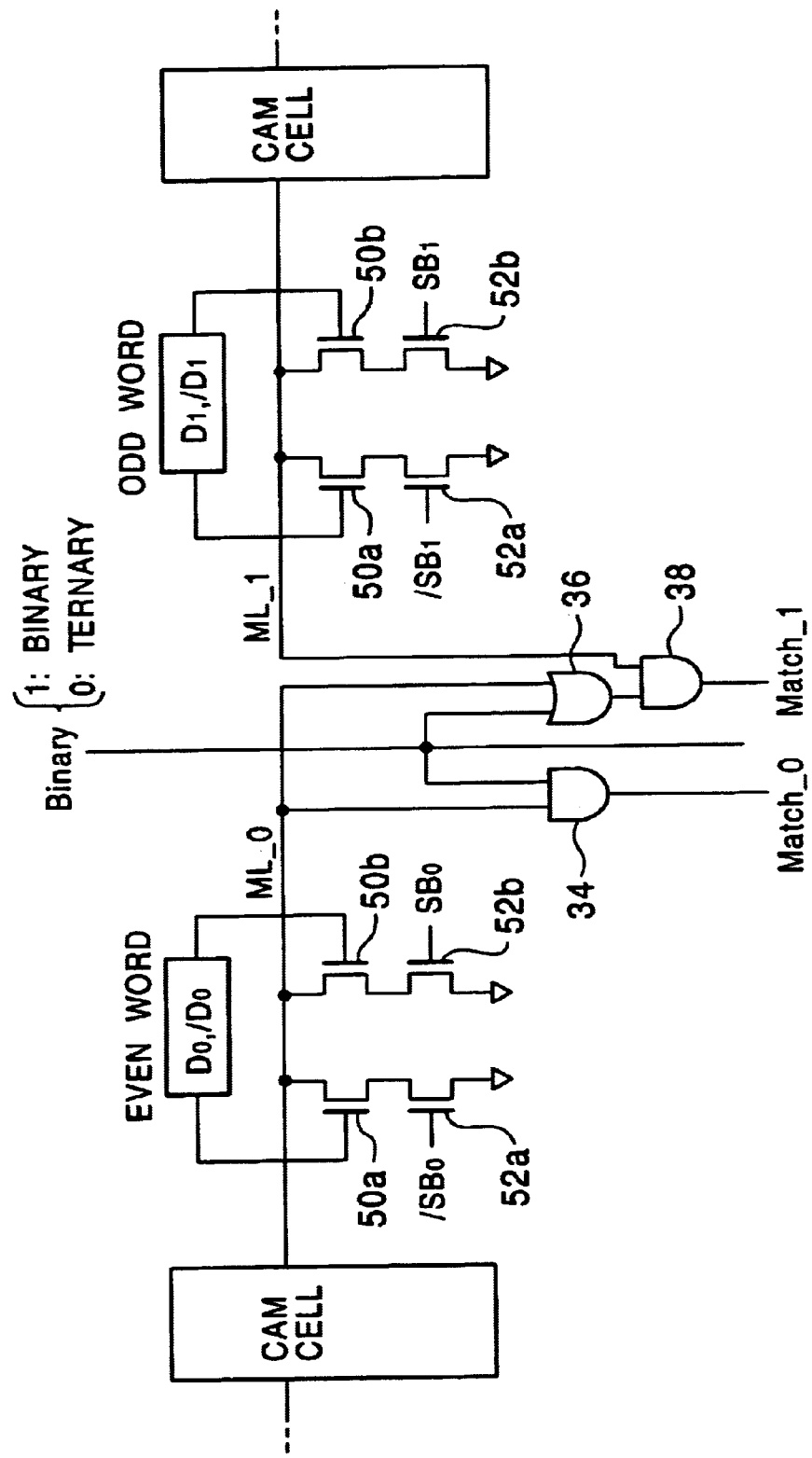
FIG. 5A is a circuit diagram of a pair of binary CAM cells and its match-line outputs in the pair of CAM words shown in FIG. 2.

FIG. 5B shows the outputs of match-lines ML_0, ML_1, Match_0, and Match_1, obtained when search data "0," "1," or "X (don't care)" (corresponding to FIG. 4B) is input if "0", "1," or "X (don't care)" has been stored as ternary data in a pair of CAM cells, according to the above description. FIG. 5A is a circuit diagram showing a pair of CAM cells in the pair of CAM words shown in FIG. 2 according to the present embodiment. The same symbols are assigned to the same components.

Data stored in a cell belonging to the even CAM word, of the pair of CAM cells is called D0, and data stored in a cell belonging to the odd CAM word, of the pair of CAM cells is called D1. As shown in the table of FIG. 5B, when "0," "1," or "X" has been stored as ternary data, if "0" or "X," "1" or "X," or "0," "1," or "X" is input as search data, respectively, the match-line output Match_1 indicates matching, and otherwise, Match_1 indicates non-matching. Therefore, it is understood that a ternary CAM cell is implemented by assigning ternary data to a pair of binary CAM cells. Since matching detection is AND detection, only when storage data of each binary CAM cell constituting the even CAM word matches the corresponding search data and storage data of each binary CAM cell constituting the odd word matches the corresponding search data, a matching output is obtained for the entire word. Consequently, a cell having any bit number in the even CAM word and a cell having any bit number in the odd CAM word can be used to form a pair of binary CAM cells. It is preferred, however, that cells having the same bit number be used as a pair to simplify the structures of the array I/O circuits and the logical-data/physical-data conversion circuit, described later in detail.

The logical-data/physical-data conversion circuit 14 performs data conversion processing between logical data (external data) and physical data (internal data) for storage data, mask data, and search data, when the CAM device 10 is used as a ternary CAM device. In the present embodiment, the logical-data/physical-data conversion circuit 14 also performs write-in mask processing for storage data and search data input from the outside to the CAM device 10.

A signal Global_mask[m-1:0] (hereinafter called G_mask) is a global mask signal input from the outside to the CAM device 10, and masks writing of storage data and search data. A bit masked by this signal is effective for all bits having the same bit number in all CAM words. A masked bit in storage data is not written into CAM words. A masked bit in search data means "don't care" and matching is always detected for the bit.

A signal Search_data[m-1:0] is search data input from the outside to the CAM device 10.

A signal data_in[m-1:0] is storage data input (written-in) from the outside to the CAM device 10, and a signal data_out[m-1:0] is storage data output (read-out) from the CAM device 10 to the outside.

A signal mask_in[m-1:0] is mask data input from the outside to the CAM device 10 when the CAM device 10 is used as a ternary CAM device, and a signal mask_out[m-1:0] is mask data output from the CAM device 10 to the outside when the CAM device 10 is used as a ternary CAM device. The mask data is used in a local mask in contrast to a global mask.

Signals Even_wd[m-1:0] and /Even_wd[m-1:0] are physical data to be written into the even word array 12a, and signals Even_sd[m-1:0] and /Even_sd[m-1:0] are search data for the even word array 12a. These pieces of data are output from the logical-data/physical-data conversion circuit 14 and input to the array I/O circuit for the even word array 12a.

A signal Even_rd[m-1:0] is physical data read from the even word array 12a. The data is output from the array I/O circuit for the even word array 12b, and is input to the logical-data/physical-data conversion circuit 14.

Signals Odd_wd[m-1:0] and /Odd_wd[m-1:0] are physical data to be written into the odd word array 12b, and signals Odd_sd[m-1:0] and /Odd_sd[m-1:0] are search data for the odd word array 12b. These pieces of data are output from the logical-data/physical-data conversion circuit 14 and input to the array I/O circuit for the odd word array 12b.

A signal Odd_rd[m-1:0] is physical data read from the odd word array 12b. The data is output from the array I/O circuit for the odd word array 12b, and is input to the logical-data/physical-data conversion circuit 14.

In a conventional CAM device, data conversion processing is not required for storage data, mask data, and search data between external data (logical data) and internal data (physical data). In other words, external data input from the outside of the CAM device to the CAM device is input as is to the inside of the CAM device, and internal data of the CAM device is output as is to the outside of the CAM device.

It is preferred that the CAM device 10 according to the present invention can be used as a binary CAM device in the same way as a binary CAM device configured, for example, with the use of the binary CAM cells 100 shown in FIG. 11. In the same way, it is preferred that the CAM device 10 according to the present invention can be used as a ternary CAM device in the same way as a ternary CAM device configured, for example, with the use of the ternary CAM cells 106 shown in FIG. 12.

In the CAM device 10 according to an embodiment of the present invention, however, it is necessary that the CAM array 12 be divided into two blocks, namely the even word array 12a and the odd word array 12b, and each word array may be independently controlled. When the CAM device 10 is used as a ternary CAM device, since two bits of CAM cells are used in combination to implement the same function as that of a ternary CAM cell, data conversion processing is required between external data and internal data.

Figure 6:
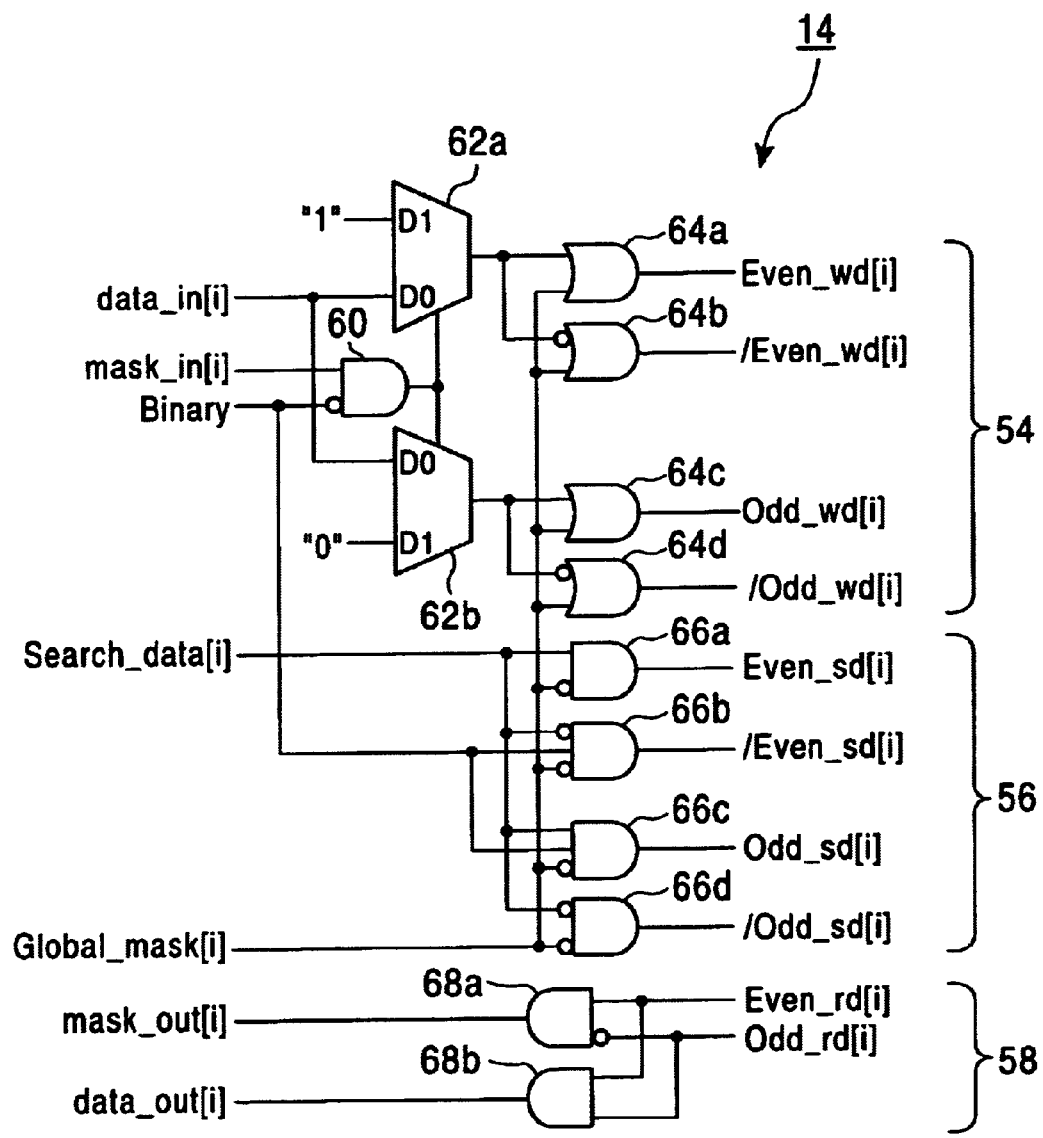
FIG. 6 is an example of a circuit diagram of a logical-data/physical-data conversion circuit used in the CAM device according to the embodiment of the present invention.

FIG. 6 shows an example of per one bit circuit diagram of the logical-data/physical-data conversion circuit used in the CAM device. The logical-data/physical-data conversion circuit 14 shown in FIG. 6 performs conversion of storage data (write-in data and read-out data), mask data, and search data according to the relationship tables shown in FIGS. 4A and 4B, and includes a write-in-data converter 54, a search-data converter 56, and a read-out-data converter 58.

The write-in-data converter 54 converts the signal data_in[i] and the signal mask_in[i] both input from the outside into the signals Even_wd[i] and /Even_wd[i] and the signals Odd_wd[i] and /Odd_wd[i] both used in the CAM device 10, according to the signal Binary, and includes an AND gate 60, two selectors 62a and 62b, and four OR gates 64a, 64b, 64c, and 64d.

In the AND gate 60, the signal mask_in[i] is input to a first input terminal thereof, the signal Binary is input to a second input terminal (inverting input) thereof, and the output thereof is connected to the selection terminals of the selectors 62a and 62b. In the selectors 62a and 62b, the signal data_in[i] is input to terminals D0 thereof, "1" (high level) is input to a terminal D1 of the selector 62a, and "0" (low level) is input to a terminal D1 of the selector 62b.

The output of the selector 62a is input to a first input terminal of the OR gate 64a and to a first input terminal (inverting input) of the OR gate 64b. The output of the selector 62b is input to a first input terminal of the OR gate 64c and to a first input terminal (inverting input) of the OR gate 64d. The signal Global_mask[i] is input in common to second input terminals of the OR gates 64a, 64b, 64c, and 64d. The signals Even_wd[i], /Even_wd[i], Odd_wd[i], and /Odd_wd[i] are output from the OR gates 64a, 64b, 64c, and 64d, respectively.

In the write-in-data converter 54, when the signal G_mask[i] is "1," namely, when a global mask is specified, the outputs of the OR gates 64a, 64b, 64c, and 64d are "1" irrespective of a condition, namely, the signals Even_wd[i], /Even_wd[i], Odd_wd[i], and /Odd_wd[i] all have a high level, and writing of storage data is masked.

When the signal G_mask[i] is "0" and the signal Binary is "1," namely, when a global mask is not specified and the CAM device 10 is used as a binary CAM device, the output of the AND gate 60 is "0."

Then, the selectors 62a and 62b output the signal data_in[i]. The signal Even_wd[i] and the signal Odd_wd[i] have the same level as the signal data in[i], and the signal /Even_wd[i] and the signal /Odd_wd[i] have the level opposite that of the signal data in[i]. In other words, storage data input from the outside is written as is into a cell of the even CAM word 28 or the corresponding cell of the odd CAM word 30 specified by an address signal Address[0].

When the signal G_mask[i] is "0" and the signal Binary is "0," namely, when a global mask is not specified and the CAM device 10 is used as a ternary CAM device, the AND gate 60 outputs the signal mask_in[i].

When the signal mask_in[i] is "1," namely, when a local mask is specified, the selectors 62a and 62b output "1" and "0," respectively. Therefore, the signals Even_wd[i] and /Even_wd[i] are "1" and "0," and the signals Odd_wd[i] and /Odd_wd[i] are "0" and "1," respectively. In other words, "1" is written into a cell of the even CAM word 28, and "0" is written into the corresponding cell of the odd CAM word 30.

When the signal mask_in[i] is "0," namely, when a local mask is not specified, the signal Even_wd[i] and the signal Odd_wd[i] have the same level as the signal data_in[i], and the signal /Even_wd[i] and the signal /Odd_wd[i] have the level opposite that of the signal data_in[i]. In other words, storage data input from the outside is written as is into a cell of the even CAM word 28 and into the corresponding cell of the odd CAM word 30.

The search-data converter 56 converts the signal Search_data[i] input from the outside into the signals Even sd[i] and /Even_sd[i] and the signals Odd_sd[i] and /Odd_sd[i] used in the CAM device 10, according to the signal Binary, and includes four AND gates 66*a*, 66*b*, 66*c*, and 66*d*.

The signal Search_data[i] is input to first input terminals of the AND gates 66*a* and 66*c* and to first input terminals (inverting inputs) of the AND gates 66*b* and 66*d*. The signal Binary is input to second input terminals of the AND gates 66*b* and 66*c*. The signal G_mask[i] is input in common to second input terminals (inverting inputs) of the AND gates 66*a* and 66*d*, and to third input terminals (inverting inputs) of the AND gates 66*b* and 66*c*. The signals Even_sd[i], /Even_sd[i], Odd_sd[i], and /Odd_sd[i] are output from the AND gates 66*a*, 66*b*, 66*c*, and 66*d*, respectively.

In the search-data converter 56, when the signal G_mask[i] is "1," namely, when a global mask is specified, the outputs of the AND gates 66*a*, 66*b*, 66*c*, and 66*d* are "0" irrespective of a condition, namely, all have a low level, and a search operation is not performed for the corresponding bit "i" (which means "don't care").

When the signal G mask[i] is "0" and the signal Binary is "1," namely, when a global mask is not specified and the CAM device 10 is used as a binary CAM device, the signal Even_sd[i] and the signal Odd_sd[i] have the same level as the signal Search data[i], and the signal /Even_sd[i] and the signal /Odd sd[i] have the level opposite that of the signal Search_data[i].

In other words, search data input from the outside is driven as is into the pairs of search bit lines SB and /SB of the even word array 12*a* and the odd word array 12*b* at the same time.

When the signal G_mask[i] is "0" and the signal Binary is "0," namely, when a global mask is not specified and the CAM device 10 is used as a ternary CAM device, the signal Even_sd[i] has the same level as the signal Search_data[i], the signal Odd_sd[i] has the level opposite that of the signal Search_data[i], and the signal /Even_sd[i] and the signal /Odd_sd[i] are "0."

In other words, when the signal Search_data[i] is "0," only the search bit bar line /SB of the odd word array 12*b* is driven by a high level, and when the signal Search_data[i] is "1," only the search bit line SB of the even word array 12*a* is driven by a high level.

The read-out-data converter 58 converts the signal Even_rd[i] and the signal Odd_rd[i] read from the inside into the signal mask_out[i] and the signal data_out[i] output to the outside, and includes two AND gates 68*a* and 68*b*.

The signal Even_rd[i] is input in common to first input terminals of the AND gates 68*a* and 68*b*, and the signal Odd_rd[i] is input in common to a second input terminal (inverting input) of the AND gate 68*a* and to a second input terminal of the AND gate 68*b*. The signal mask_out[i] and the signal data_out[i] are output from the AND gates 68*a* and 68*b*, respectively.

In the read-out-data converter 58, when the CAM device 10 is used as a binary CAM device, a sense amplifier in an array I/O circuit specified by the lowest-order address signal Address[0] of the even word array 12*a* or of the odd word array 12*b* is activated, and only one of the signal Even_rd[i] and the signal Odd_rd[i] has effective data. The states of the sense amplifiers are set to a high level at stand-by.

Therefore, one of the signal Even_rd[i] and the signal Odd_rd[i], specified by the signal Address[0] is output as the signal data_out[i]. The states of the sense amplifiers used for reading storage data are not limited to the high level at stand-by. When they are set to a low level, it is necessary to change the logic of the read-out-data converter 58 accordingly.

When the CAM device 10 is used as a ternary CAM device, the sense amplifiers of the array I/O circuits in the even word array 12*a* and the odd word array 12*b* are activated at the same time, and the signal Even_rd[i] and the signal Odd_rd[i] have effective data at the same time.

When a signal Even_rd[i] of "0" and a signal Odd_rd[i] of "0" are input to the read-out-data converter 58, namely, when "0" has been stored as storage data in a ternary CAM cell implemented by a combination of two bits of binary CAM cells, the signal data_out[i] and the signal mask_out[i] are "0."

When a signal Even_rd[i] of "1" and a signal Odd_rd[i] of "1" are input to the read-out-data converter 58, namely, when "1" has been stored as storage data, the signal data_out[i] is "1" and the signal mask_out[i] is "0."

When a signal Even_rd[i] of "1" and a signal Odd_rd[i] of "0" are input to the read-out-data converter 58, namely, when "X (don't care)" has been stored as storage data, the signal data_out[i] is "0" and the signal mask_out[i] is "1."

It is a matter of course that the data conversion processing performed by the logical-data/physical-data conversion circuit 14 needs to be changed according to the internal structure of the CAM device 10, such as a division method of dividing the CAM array 12 into blocks, a combination method of two binary CAM cells, and assignment of three states of a ternary CAM cell to four states of two binary CAM cells.

In the present embodiment, to be able to use the CAM device 10 as a binary CAM device or as a ternary CAM device in the same way as a conventional binary CAM device or a conventional ternary CAM device, conversion processing is applied to logical data and to search data. The way the CAM device 10 is used is not limited to this case. The CAM device may be used in another way according to the present invention, in which data to which the logical-data/physical-data conversion circuit 14 has applied the data conversion processing is written.

Back to FIG. 1, one of the array I/O circuits 16 is used for the even word array 12*a*, and the other is used for the odd word array 12*b*.

Each array I/O circuit includes drivers for driving pairs SBs and /SBs of search bit lines, drivers for driving pairs BLs and /BLs of bit lines, reading sense amplifiers, and pre-charge circuits. The operation of each component is controlled by a control signal generated by the array I/O control circuit 18, described below.

The array I/O control circuit 18 generates various control signals for controlling the operations of the array I/O circuits for the even word array and for the odd word array, according to the lowest-order address signal Address[0] and the signal Binary. More specifically, the array I/O control circuit 18 generates enable signals, such as a signal Even_sre, a signal Odd_sre, a signal Even_wre, a signal Odd_wre, a signal Even_rde, and a signal Odd_rde, and control signals, such as a signal Even_blpc and a signal Odd_blpc.

The signals Even_sre and Odd_sre instruct driving of pairs SBs and /SBs of search bit lines.

The signals Even_wre and Odd_wre instruct driving of pairs BLs and /BLs of bit lines.

When the CAM device is used as a binary CAM device, only one of the signals Even_wre and Odd_wre according to the signal Address[0] is enabled, and writing is performed for only one of a pair of an even CAM word and an odd CAM word. In contrast, when the CAM device 10 is used as a ternary CAM device, both of the signals Even_wre and Odd_wre are enabled irrespective of the signal Address[0], and writing is performed for both of a pair of an even CAM word and an odd CAM word at the same time.

The signals Even_rde and Odd_rde enable the sense amplifiers for pairs BLs and /BLs of bit lines.

When the CAM device 10 is used as a binary CAM device, physical data is read from only one CAM word corresponding to the signal Address[0], of a pair of an even CAM word and an odd CAM word, in the same way as for writing of physical data. In contrast, when the CAM device is used as a ternary CAM device, physical data is read from both of a pair of an even CAM word and an odd CAM word at the same time.

The signals Even_blpc and Odd_blpc instruct precharging of pairs BLs and /BLs of bit lines, and stop precharging of pairs BLs and /BLs of bit lines when physical data is read or written.

The array I/O control circuit 18 outputs various control signal in synchronization with a timing signal generated by a timing generating circuit 20.

In the CAM device 10 shown in FIG. 1, the decoder 22 decodes N−1 bits of signals Address[N−1:1], not including the lowest-order bit, and drives two CAM words corresponding thereto, namely, a common word line for specifying a pair of an even CAM word and an odd CAM word. Physical data is written into or read from a CAM word specified by the signal Address[0] through the array I/O control circuit 18, described before, of the two CAM words driven by the common word line.

The priority encoder 24 sequentially uses match-line outputs input from all CAM words included in the CAM array 12 through match lines Match_0, Match_1, . . . , and Match_$2^{N-1}$ to encode the addresses of CAM words for which matching has been detected, according to a predetermined priority, and sequentially outputs them as highest hit addresses HHA[N−1:0].

Since the CAM device 10 according to the present invention is configured with the use of binary CAM cells, and two bits of binary CAM cells are used in combination as a ternary CAM cell, the CAM device 10 can be used as a binary CAM device and also as a ternary CAM device. When the CAM device 10 is used as a binary CAM device, it operates in the same way as a conventional binary CAM device. When the CAM device 10 is used as a ternary CAM device, it operates in the same way as a conventional ternary CAM device.

To clarify an extent to which the present invention is applied, a CAM device according to another embodiment of the present invention will be described next.

Figure 7:
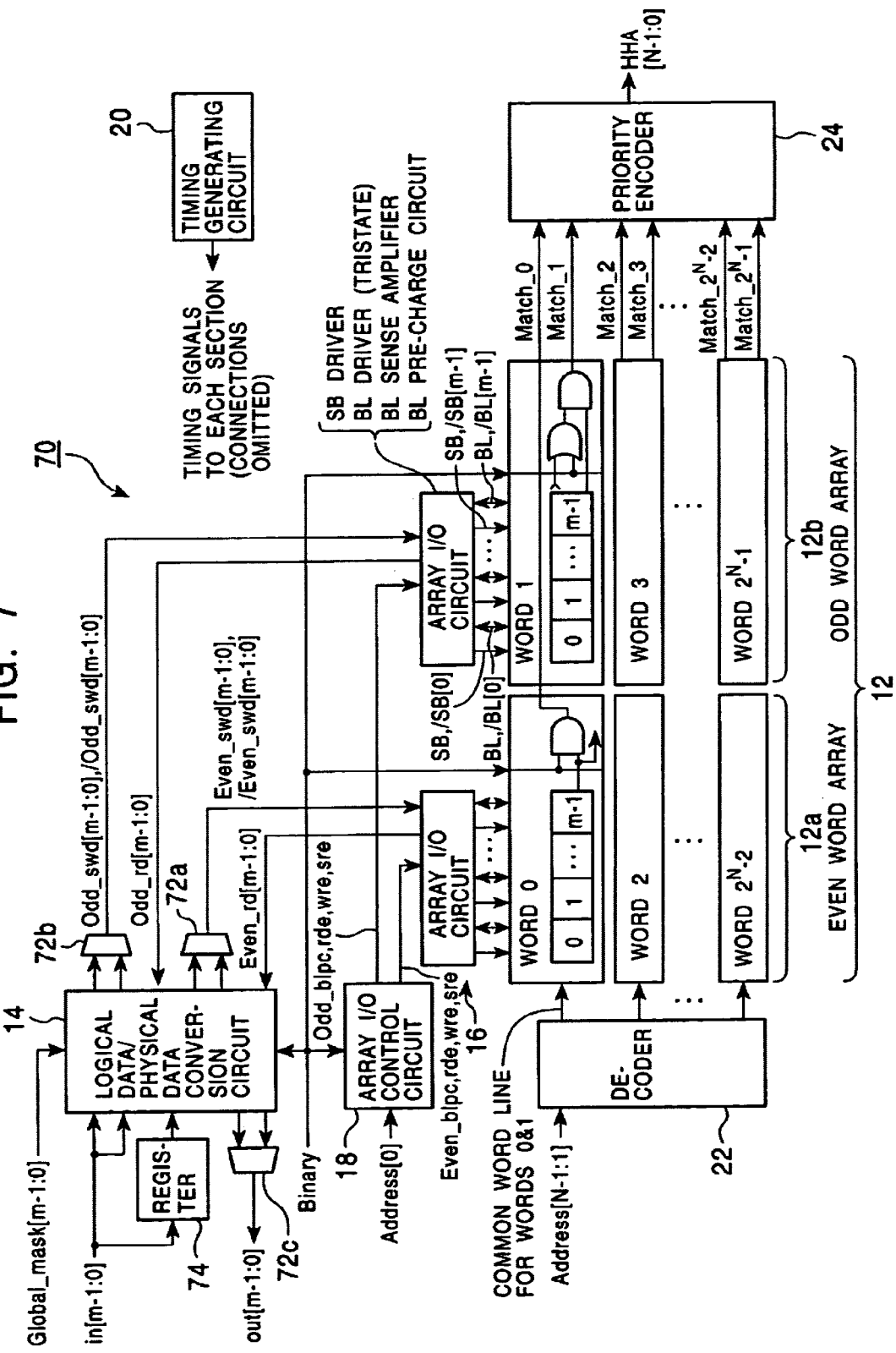
FIG. 7 is an outlined structural view of a CAM device according to another embodiment of the present invention.

FIG. 7 is an outlined structural view of a CAM device according to another embodiment of the present invention.

The CAM device 70 shown in FIG. 7 differs from the CAM device 10 shown in FIG. 1 in that three selectors 72a, 72b, and 72c and a register 74 are additionally provided, and data lines for search data, storage data, and mask data input from the outside, pairs of data lines for storage data and search data used in the inside, and data lines for storage data and mask data read to the outside are integrated (made in common).

A signal in[m−1:0] used for the signal Search data[m−1:0], the signal data_in[m−1:0], and the signal mask in[m−1:0] is input from the outside to the logical-data/physical-data conversion circuit 14. The signal in[m−1:0] is also input to the register 74, and the output of the register 74 is input to the logical-data/physical-data conversion circuit 14.

Signal data in[m−1:0], signal mask in[m−1:0], and signal Search_data[m−1:0] are input in a time division manner as the signals in[m−1:0]. Whichever is input first of signal data_in and signal mask_in is held in the register 74, and input to the logical-data/physical-data conversion circuit 14 together with whichever is input last.

Signal Even_wd[m−1:0] and /Even_wd[m−1:0] and signals Even_sd[m−1:0] and /Even_sd[m−1:0] are input from the logical-data/physical-data conversion circuit 14 to the selector 72a, and signals Even_swd[m−1:0] and /Even_swd[m−1:0] are output from the selector 72a to a local I/O corresponding to the even word array 12a.

In the same way, signals Odd_wd[m−1:0] and /Odd_wd[m−1:0] and signals Odd_sd[m−1:0] and /Odd_sd[m−1:0] are input from the logical-data/physical-data conversion circuit 14 to the selector 72b, and signals Odd_swd[m−1:0] and /Odd_swd[m−1:0] are output from the selector 72b to a local I/O corresponding to the odd word array 12b.

A signal data out[m−1:0] and a signal mask_out[m−1:0] are input from the logical-data/physical-data conversion circuit 14 to the selector 72c, and a signal out[m−1:0] is output from the selector 72c to the outside.

In the CAM device 70 shown in FIG. 7, since data lines are integrated, and integrated data lines are used in a time division manner, the number of data lines used in the inside is reduced and the number of input and output pins is also reduced.

Other CAM words which can be used in a CAM device according to the present invention will be described next.

As described above, a combination of two bits of binary CAM cells is not limited, and any two bits of binary CAM cells can be used in combination to implement the function of a ternary CAM cell.

Figure 8:
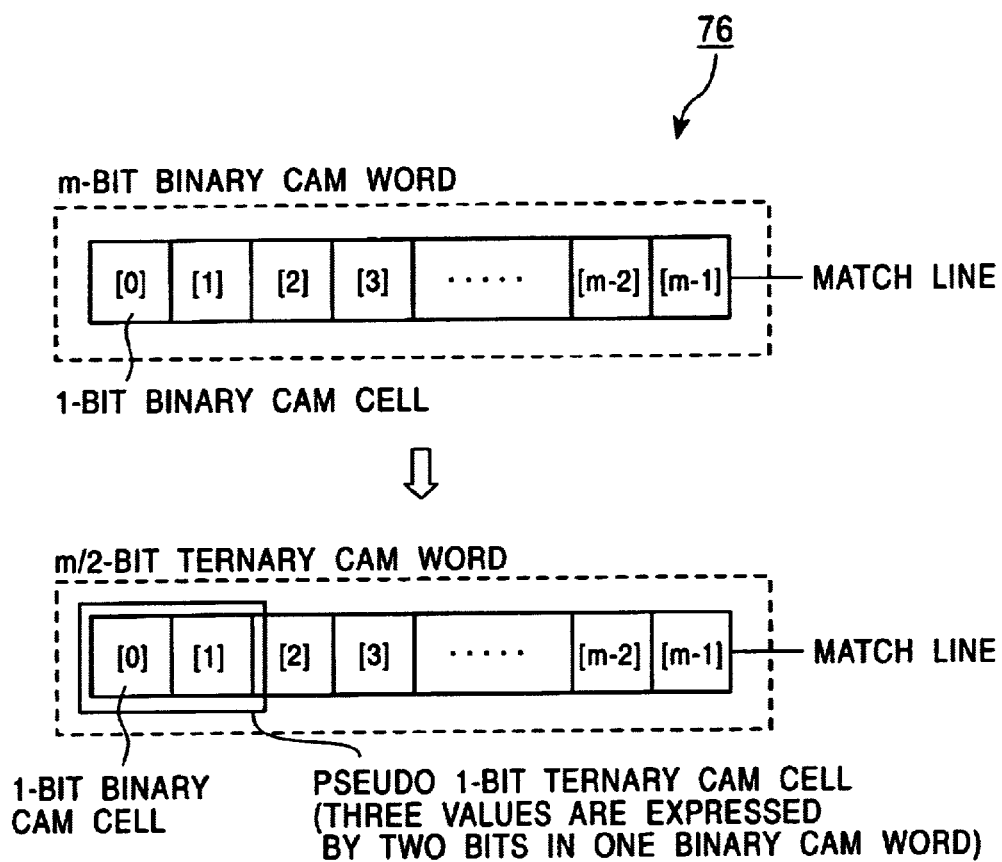
FIG. 8 is an outlined structural view of a CAM word used in the CAM device according to the another embodiment of the present invention.

In a CAM word 76 shown in FIG. 8, two bits of binary CAM cells in one CAM word, an even bit and an odd bit in FIG. 8, are used in combination to implement the function of a ternary CAM cell.

When two bits of binary CAM cells are used in combination to implement the function of a ternary CAM cell in this way, the bit width of one word becomes half. In the CAM device 10 shown in FIG. 1, the CAM array 12 is divided into the even word array 12a and the odd word array 12b, and they are controlled separately. When a CAM device according to the present invention is configured with the use of the CAM word 76 shown in FIG. 8, it is necessary that the CAM word be divided into even bits and odd bits, and they be controlled separately.

Since the relationship between logical data and physical data, and the relationship between search data and search bit line outputs obtained when the CAM device of the present embodiment is used as a binary CAM device, and the relationship between logical data and physical data, and the relationship between search data and search bit line outputs (even bits and odd bits) obtained when the CAM device of the present embodiment is used as a ternary CAM device are the same as those shown in FIGS. 4A and 4B, descriptions thereof are omitted.

A CAM device configured with the use of the CAM word 76 shown in FIG. 8 basically operates in the same way as the CAM device 10, except that, whereas pairs SBs and /SBs of search bit lines are controlled separately between the even word array and the odd word array in the CAM device 10 configured with the use of the pair 26 of CAM words shown in FIG. 2, even bits and odd bits are separately controlled in the CAM device configured with the use of the CAM word 76 of FIG. 8.

In FIG. 8, an even bit and an odd bit are used in combination to implement the function of a ternary CAM cell. Any two bits of binary CAM cells may be used in combination in one CAM word.

Figure 9:
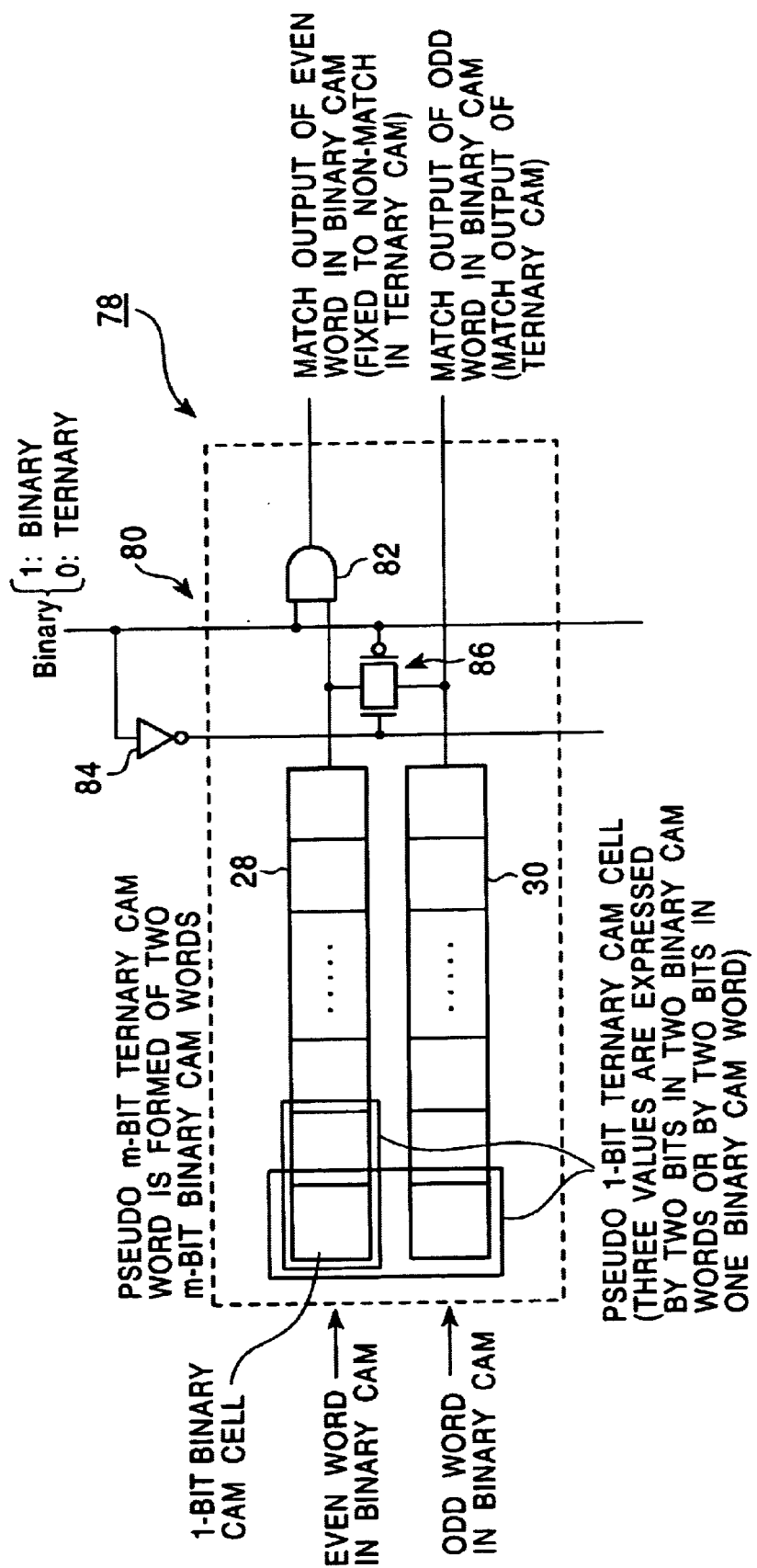
FIG. 9 is an outlined structural view of another CAM word used in the CAM device according to the another embodiment of the present invention.
Figure 10:
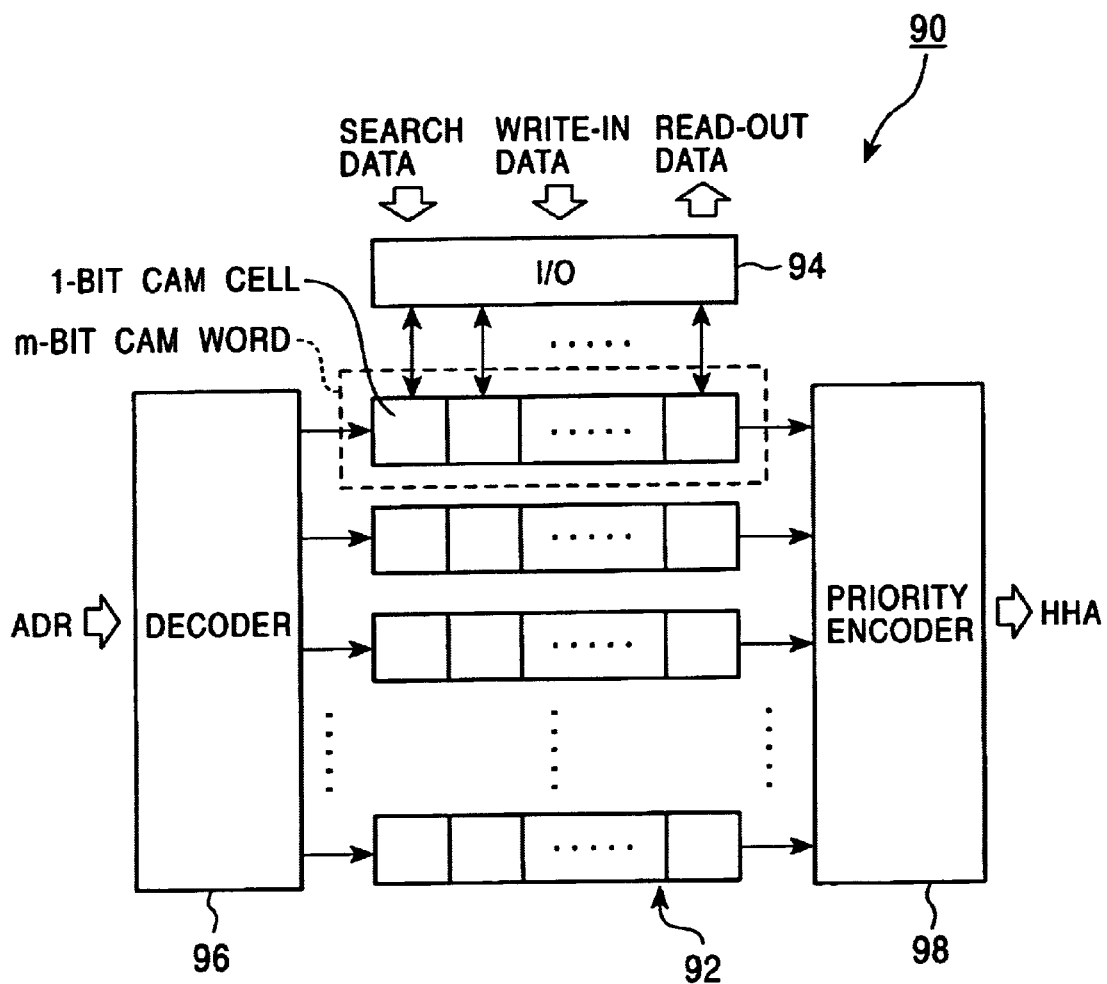
FIG. 10 is an outlined structural view of a conventional CAM device.

A pair 78 of CAM words shown in FIG. 9 can be used in two ways. In one way, two bits of binary CAM cells in one CAM word, that is, an even bit cell and an adjacent odd bit cell in FIG. 9, are used in combination to implement the function of a ternary CAM cell. In the other way, two binary CAM cells one of which is included in one word of the pair 78 of CAM words and the other of which is included in the other word, that is, a cell included in the even CAM word 28 and a cell included in the odd CAM word 30 which have the same bit number in FIG. 9, are used in combination to implement the function of a ternary CAM cell.

The pair 78 of CAM words shown in FIG. 9 is obtained by changing the control circuit 32 in the pair 26 of CAM words shown in FIG. 2. In the pair 78 of CAM words shown in FIG. 9, a control circuit 80 includes an AND gate 82, an inverter 84, and a switch circuit 86. The switch circuit 86 is formed of a n-type MOS transistor (NMOS) and a p-type MOS transistor (PMOS).

The signal Binary and the match-line output of the even CAM word 28 are input to the AND gate 82. The NMOS and PMOS of the switch circuit 86 are connected in parallel between the match-line output of the even CAM word 28 and the match-line output of the odd CAM word 30. The signal Binary is input to the gate of the NMOS through the inverter 84, and the signal Binary is directly input to the gate of the PMOS.

When the CAM device configured with the use of the pair 78 of CAM words is used as a binary CAM device (signal Binary is "1"), the switch circuit is off. Therefore, the match-line output of the even CAM word 28 is output from the AND gate 82, and the match-line output of the even CAM word 28 and the match-line output of the odd CAM word 30 are electrically separated. The even CAM word 28 and the odd CAM word 30 function independently each as a word.

When the CAM device configured with the use of the pair 78 of CAM words is used as a ternary CAM device (signal Binary is "0"), the output of the AND gate 82 has a low level, and the switch circuit is on. Therefore, the match-line output of the even CAM word 28 and the match-line output of the odd CAM word 30 are electrically connected. AND search is performed for the even CAM word 28 and the odd CAM word 30 with the odd CAM word 30 serving as a representative word.

CAM devices and structure methods therefor according to the present invention are basically as described above.

CAM devices and structure methods therefor according to the present invention have been described above in detail. The present invention is not limited to the above embodiments. Various improvements and modifications are allowed within the scope and spirit of the present invention.

As described above in detail, a CAM device according to the present invention is configured with a structure method for a CAM device according to the present invention being applied. In a CAM device according to the present invention, binary CAM cells in which binary data can be specified are used. In addition, the CAM device can be used as a binary CAM device with its binary CAM cells being used as binary CAM cells, and can also be used as a ternary CAM device with its pairs of binary CAM cells being used in combination as ternary CAM cells.

Further, in a structure method for a CAM device, according to the present invention, two bits of binary CAM cells are used in combination to implement the function of a ternary CAM cell.

Therefore, according to a CAM device and a structure method therefor of the present invention, the CAM device can be used either as a binary CAM device or as a ternary CAM device, and memory bits are not used wastefully even when the CAM device is used as a binary CAM device.

What is claimed is:

1. A content addressable memory (CAM) device configured with binary CAM cells capable of holding binary data, the CAM device capable of being used either as a binary CAM device with the binary CAM cells being used as binary CAM cells or as a ternary CAM device with the binary CAM cells being used as ternary CAM cells capable of holding ternary data in a way in which, in each pair of two bits of the binary CAM cells, three states, "0," "1," and "X (don't care)" are assigned to four states, "00," "01," "10," and "11," expressed by two-bit data stored in the pair, wherein:

each of the pairs of the binary CAM cells constituting the ternary CAM cells is included in two different CAM words; and the two different CAM words are an even word having an even word number and an odd word having the odd word number following the even word number.

2. A CAM device according to claim 1, wherein each of the pairs of the binary CAM cells constituting the ternary CAM cells is included in an even word and the odd word following the even word and has the same bit number.

3. A content addressable memory (CAM) device configured with binary CAM cells capable of holding binary data, the CAM device capable of being used either as a binary CAM device with the binary CAM cells being used as binary CAM cells or as a ternary CAM device with the binary CAM cells being used as ternary CAM cells capable of holding ternary data in a way in which, in each pair of two bits of the binary CAM cells, three states, "0," "1," and "X (don't care)" are assigned to four states, "00" "01," "10," and "11," expressed by two-bit data stored in the pair, wherein:

each of the pairs of the binary CAM cells constituting the ternary CAM cells is included in one CAM word; and each of the pairs of the binary CAM cells constituting the ternary CAM cells has an even bit number and an odd bit number adjacent to each other in one CAM word.

4. A content addressable memory (CAM) device configured with binary CAM cells capable of holding binary data, the CAM device capable of being used either as a binary CAM device with the binary CAM cells being used as binary CAM cells or as a ternary CAM device with the binary CAM cells being used as ternary CAM cells capable of holding ternary data in a way in which, in each pair of two bits of the binary CAM cells, three states, "0," "1," and "X (don't care)" are assigned to four states, "00," "01," "10," and "11," expressed by two-bit data stored in the pair, wherein, during a search operation, a pair of search bit lines used for one binary CAM cell of each of the pairs of the binary CAM cells and a pair of search bit lines used for the other binary CAM cell are separately controlled.

5. A content addressable memory (CAM) device comprising:
   a CAM array including a plurality of CAM words each formed of binary CAM cells;
   binary/ternary setting means for making a setting of a case in which the binary CAM cells are used as binary CAM cells or a setting of a case in which each pair of two bits of the binary CAM cells is used as a ternary cell; and
   a logical-data/physical-data conversion circuit for converting logical data input from the outside to physical data used in the inside of the CAM device according to a setting made by the binary/ternary setting means,
   wherein the logical-data/physical-data conversion circuit comprises:
      a write-in-data converter for converting storage data and mask data for ternary CAM cells, input from the outside to data to be stored in each pair of two bits of binary CAM cells;
      a search-data converter for converting search data input from the outside to a search bit line signal for each pair of two bits of binary CAM cells; and
      a read-out-data converter for converting physical data read from each pair of two bits of binary CAM cells, constituting a ternary CAM cell, to logical data.

6. A CAM device according to claim 5, wherein the binary/ternary setting means is a terminal for inputting a binary/ternary setting signal from the outside.

7. A CAM device according to claim 5, wherein the binary/ternary setting means is an internal register for holding a binary/ternary setting signal.

8. A CAM device according to claim 5, further comprising an array I/O circuit for sending write-in data and search data output from the logical-data/physical-data conversion circuit to CAM cells and for sending data read from the CAM cells to the logical-data/physical-data conversion circuit, according to the binary/ternary setting means.

9. A CAM device according to claim 7, further comprising an array I/O circuit for sending write-in data and search data output from the logical-data/physical-data conversion circuit to CAM cells and for sending data read from the CAM cells to the logical-data/physical-data conversion circuit, according to the binary/ternary setting means.

10. A CAM device according to claim 8,
    wherein the CAM array is formed of an even CAM array including CAM words having even word numbers and an odd CAM array including CAM words having odd word numbers;
    a match line of one word included in the even CAM array is coupled with a match line of the word having the word number following the one word, included in the odd CAM array, by a logic circuit; and
    a match output of a binary CAM word or a match output of a ternary CAM word is output according to a signal of the binary/ternary setting means.

11. A CAM device according to claim 10, wherein the array I/O circuit is provided for each of the even CAM array and the odd CAM array.

12. A CAM device according to claim 11, further comprising:
    an external data input line made by integrating a data line for search data input from the outside, a data line for storage data input from the outside, and a data line for mask data input from the outside, for inputting each of the data in a time division manner; and
    an input register for holding data input first of the storage data and the mask data, and for outputting held data to the logical-data/physical-data conversion circuit together with the data input last.

13. A CAM device according to claim 12, further comprising a selector connected at its inputs to a data line for read storage data and to a data line for read mask data, both data output from the logical-data/physical-data conversion circuit, for outputting each of the data in a time division manner.

14. A CAM device according to claim 13, further comprising:
    a selector for receiving write-in data for an even word and search data for the even word, both data output from the logical-data/physical-data conversion circuit, and for outputting one of the data to the even array I/O circuit according to a data writing operation or a data search operation; and
    a selector for receiving write-in data for an odd word and search data for the odd word, both data output from the logical-data/physical-data conversion circuit, and for outputting one of the data to the odd array I/O circuit according to a data writing operation or a data search operation.

* * * * *